(12) United States Patent
Kashiwazaki

(10) Patent No.: US 7,349,227 B2
(45) Date of Patent: Mar. 25, 2008

(54) ELECTRONIC CONTROL DEVICE

(75) Inventor: Atsushi Kashiwazaki, Anjo (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 155 days.

(21) Appl. No.: 11/104,630

(22) Filed: Apr. 13, 2005

(65) Prior Publication Data

US 2005/0239343 A1 Oct. 27, 2005

(30) Foreign Application Priority Data

Apr. 27, 2004 (JP) ............................. 2004-131580

(51) Int. Cl.
*H05K 7/14* (2006.01)
(52) U.S. Cl. .................. 361/796; 361/752; 361/797; 361/730; 361/714; 361/715; 174/521; 174/50.52; 211/41.17
(58) Field of Classification Search ................ 361/749, 361/752; 174/50.52, 520, 521, 254
See application file for complete search history.

(56) References Cited

U.S. PATENT DOCUMENTS 3,766,439 A * 10/1973 Issacson ..................... 361/714
3,873,889 A * 3/1975 Leyba ........................ 361/728
5,113,316 A * 5/1992 Navarro et al. ............. 361/744

FOREIGN PATENT DOCUMENTS

| JP | 57-148868 | 9/1982 |
|----|-----------|--------|
| JP | 59-22399 | 2/1984 |
| JP | 2001-168545 | 6/2001 |
| JP | 2002-134939 | 5/2002 |

* cited by examiner

*Primary Examiner*—Tuan T. Dinh
*Assistant Examiner*—Dameon E Levi
(74) *Attorney, Agent, or Firm*—Nixon & Vanderhye P.C.

(57) ABSTRACT

An electronic control device includes a circuit substrate consisting of four rigid portions and intervening flexible portions which are serially connected to each other. This circuit substrate is accommodated in a casing in such a manner that respective flexible portions are folded by 180° to dispose respective rigid portions to be parallel to each other. The rigid portions, positioned at both ends of the circuit substrate, mount connectors so as to face to mutually opposed directions. Other rigid portions mount electronic components and heater components. The outermost connectors are connected to different connection objects. The casing is made of a metal material so that heat generating from the heater components can be transmitted via heat dissipation gel to the casing and efficiently released to the outside.

20 Claims, 15 Drawing Sheets

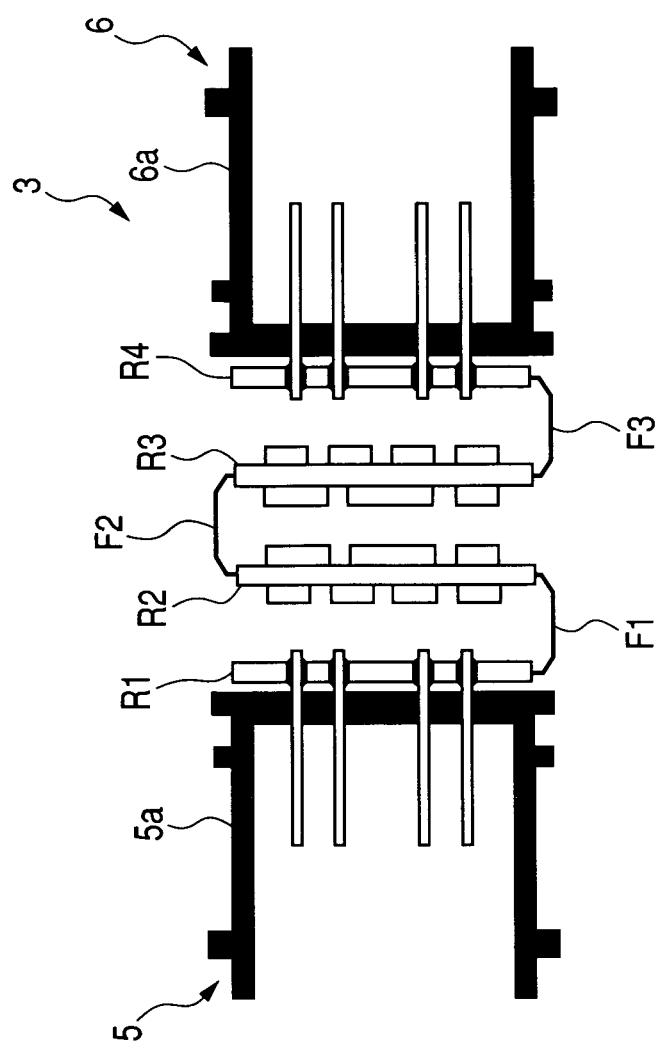
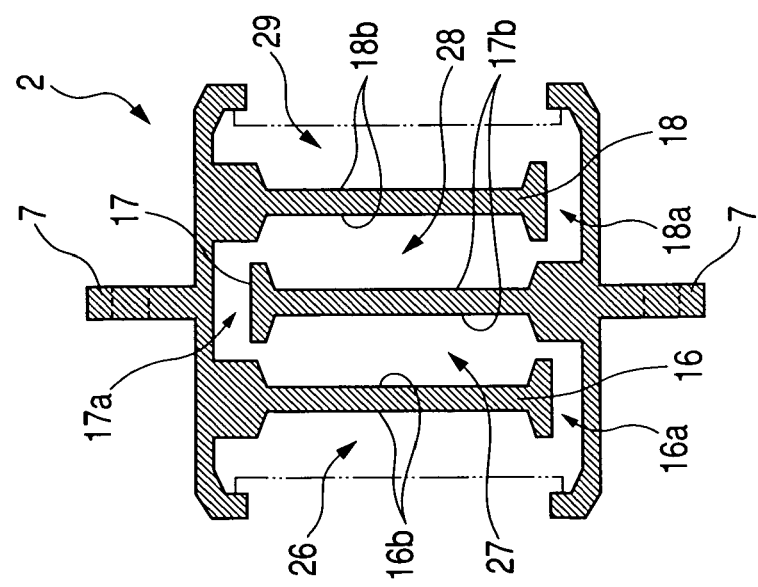
FIG. 4A
FIG. 4B

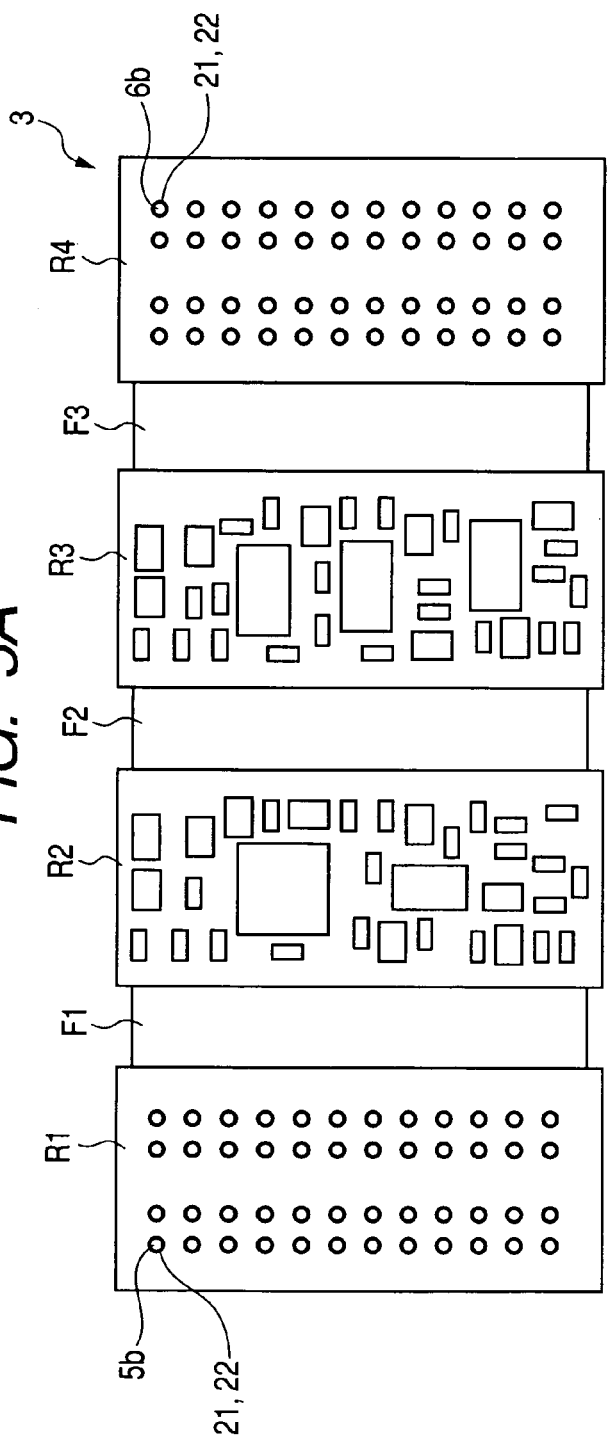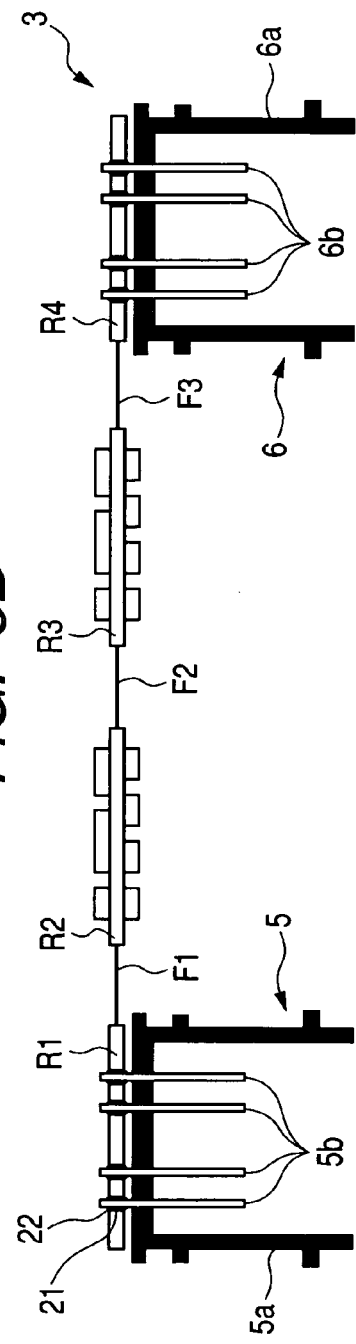
FIG. 5A
FIG. 5B

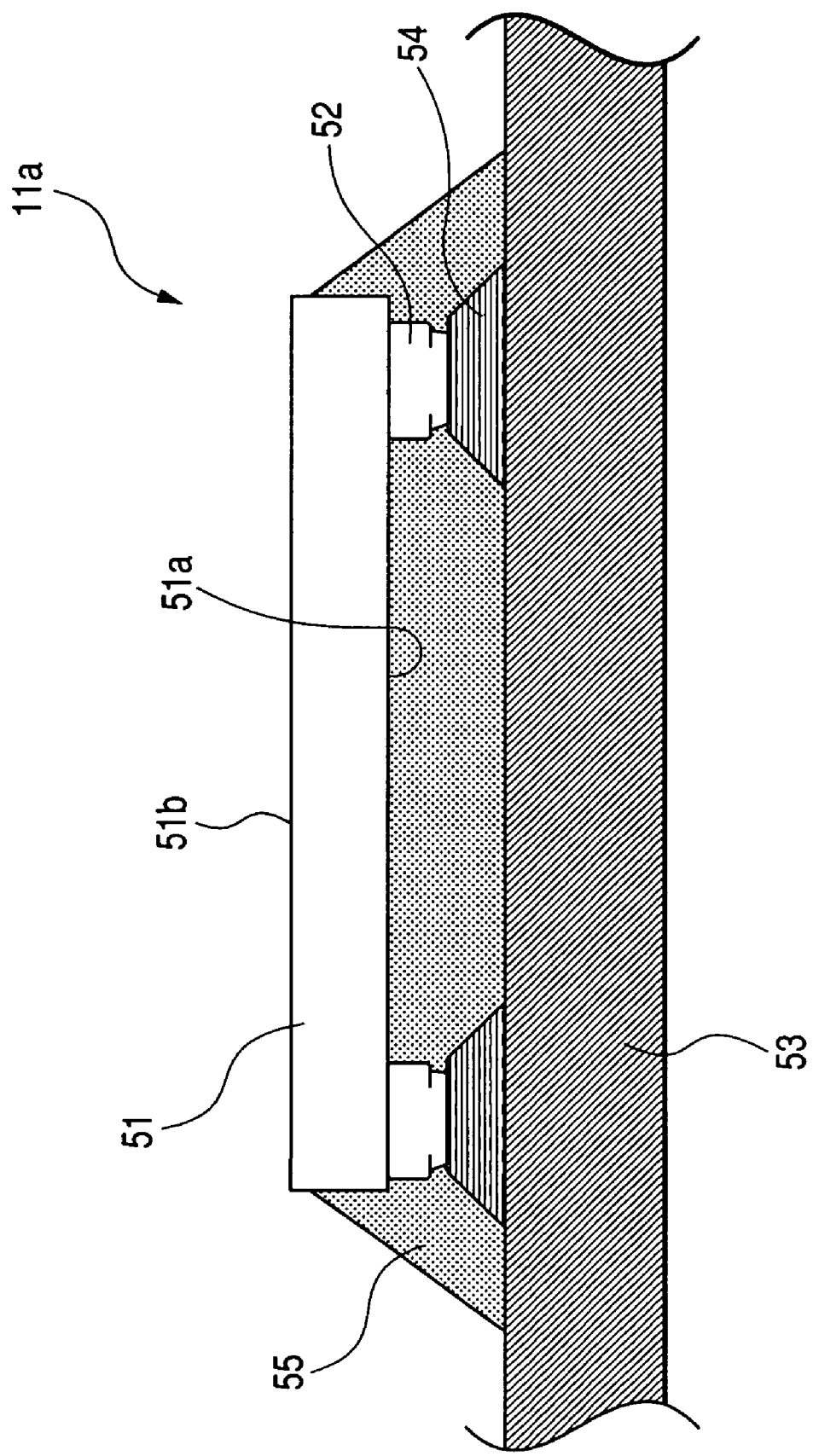

ELECTRONIC CONTROL DEVICE

CROSS-REFERENCE TO RELATED APPLICATION

This application is based upon and claims the benefit of priority from earlier Japanese Patent Application No. 2004-131580 filed on Apr. 27, 2004 so that the description of which is incorporated herein by reference.

BACKGROUND OF THE INVENTION

The present invention relates to an electronic control device.

FIG. 15 shows a conventional electronic control device 100 including electronic components 102 and a connector 103 mounted on a plane of a circuit substrate (i.e. printed substrate) 101 which are accommodated in a metal-made casing 107 (for example, refer to Japanese Patent Application Laid-open Nos. 2001-168545 and 2002-134939).

In the electronic control device 100 shown in FIG. 15, the connector 103 consists of a connector housing 103a and a plurality of connector pins 103b. The circuit substrate 101 has through-holes 104 into which the connector pins 103b of the connector 103 are inserted and bonded by solder. The circuit substrate 101 is fixed to the casing 107 by means of screws. The casing 107 is closed with a cover 108 and the connector 103. According to this conventional electronic control device 100, water-proof arrangements are employed for the coupling portion of the connector 103 and the casing 107 (or the cover 108) as well as for the coupling portion of the casing 107 and the cover 108. More specifically, silicone adhesive 109 is applied to these coupling portions to seal the inside space of the electronic control device 100.

According to this kind of electronic control device, due to recent advancement of high-density mounting techniques, the surface available for electronic components other than the connectors remains in a narrowly limited region on the circuit substrate. However, regarding the connector, its size tends to be increasing because the number of required pins is increasing due to functions required for recent electronic control devices.

In this respect, according to the conventional mounting structure disposing a large connector and various electronic components on the same plane of one substrate, it is difficult to downsize the circuit substrate and accordingly the entire size of the electronic control device cannot be reduced.

Especially, according to an electronic control device installed in an automotive vehicle, the number of required pins of the connector reaches approximately 200 to realize advanced functions of automotive vehicles for example to control engines and/or automatic transmissions. Furthermore, there is the tendency that recent automotive vehicles secure larger occupant spaces. On the other hand, the space available for the electronic control devices is decreasing. Accordingly, it is necessary to effectively reduce the size of the electronic control device so that the electronic control device equipped with a large connector can be installed in a limited space of an automotive vehicle.

SUMMARY OF THE INVENTION

In view of the above-described problems, the present invention has an object to provide a compact electronic control device.

In order to accomplish the above and other related objects, the present invention provides an electronic control device including a substrate block including at least three rigid substrates which are serially connected via electrically conductive members to form a three-dimensional structure. According to the present invention, among a plurality of rigid substrates arranging the substrate block, two outermost rigid substrates (i.e. two rigid substrates positioned at both ends) of the substrate block are arranged to mount connectors to be coupled to connectors of external connection objects. The substrate block is accommodated in a casing in such a manner that the connectors mounted on two outermost rigid substrates of the substrate block are exposed to the outside at least at portions where the connectors are coupled with the connectors of the external connection objects.

BRIEF DESCRIPTION OF THE DRAWINGS

The above and other objects, features and advantages of the present invention will become more apparent from the following detailed description which is to be read in conjunction with the accompanying drawings, in which:

FIG. 4A is a cross-sectional view showing a casing and FIG. 4B is a cross-sectional view showing a circuit substrate, in a condition that the circuit substrate is taken out of the electronic control device in accordance with the first embodiment of the present invention;

FIGS. 5A and 5B are plan and front views respectively showing an unholded circuit substrate of the electronic control device in accordance with the first embodiment of the present invention;

FIG. 10 is a cross-sectional view showing a package including a semiconductor chip connected to a package substrate by flip chip connection in accordance with the first embodiment of the present invention;

DESCRIPTION OF THE PREFERRED EMBODIMENTS

Figure 1:
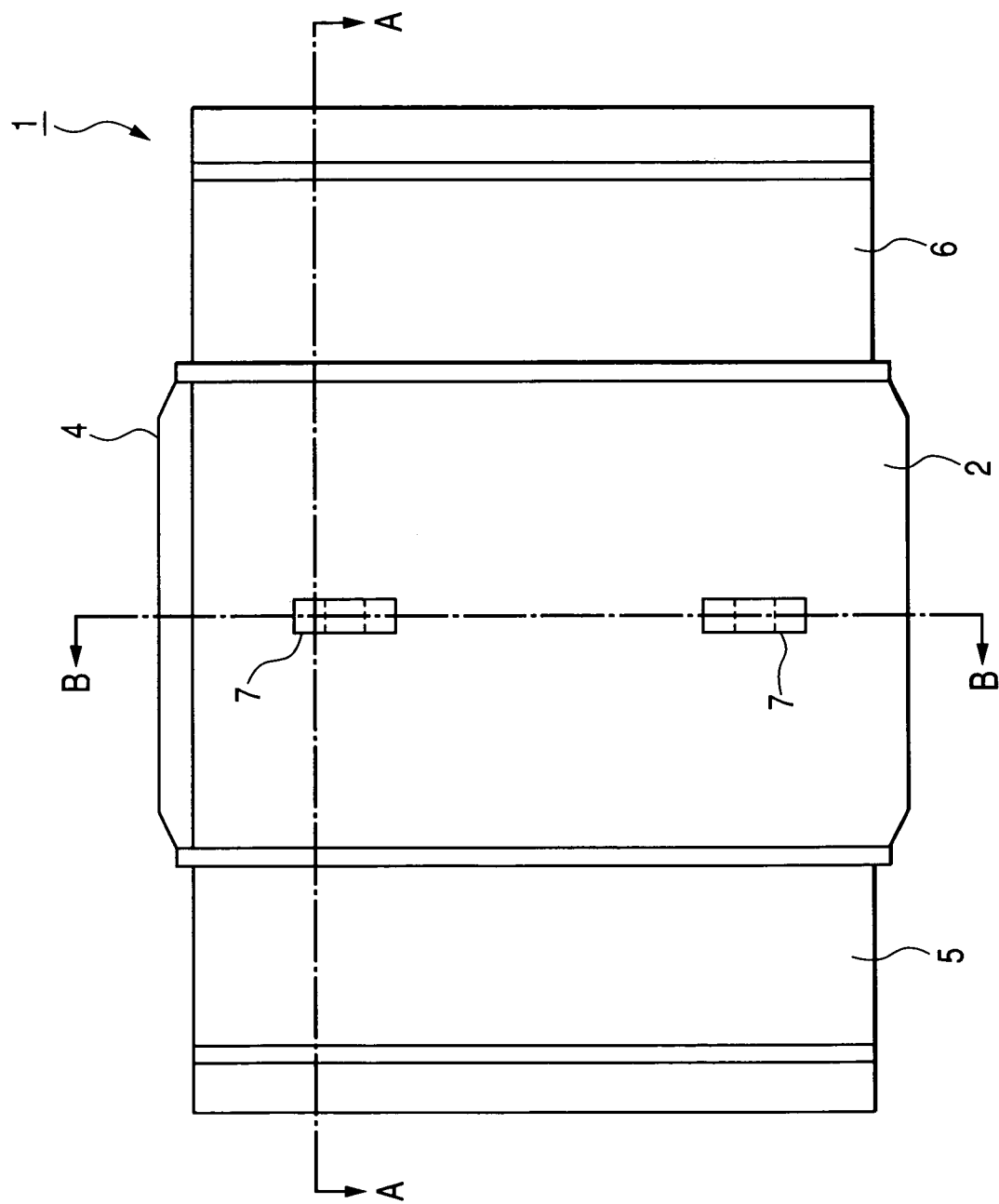
FIG. 1 is a plan view showing an electronic control device in accordance with a first embodiment of the present invention.

For the purpose of providing best modes for embodying the present invention, the inventor of this patent application provides an electronic control device including a substrate block including at least three rigid substrates which are serially connected via electrically conductive members to form a three-dimensional structure, wherein the rigid substrates arranging the substrate block include two rigid substrates positioned at both ends of the substrate block and mounting connectors to be coupled to connectors of external connection objects.

The substrate block is accommodated in a casing in such a manner that the connectors mounted on two rigid substrates positioned at both ends of the substrate block are exposed to the outside at least at portions where the connectors are coupled with the connectors of the external connection objects.

More specifically, all of the substrate planes of respective rigid substrates being serially connected via the electrically conductive member are not disposed on the same plane. The substrate planes of at least two neighboring rigid substrates form an intersectional angle less than 180°. In other words, an assembly of two neighboring rigid substrates connected via an intervening electrically conductive member is regarded as one small substrate block. This small substrate block is folded about the electrically conductive member.

In this case, the meaning of "neighboring" represents the condition that two rigid substrates are mutually connected via an electrically conductive member. Furthermore, the rigid substrates positioned at both ends of the substrate block are rigid substrates each having a free outer end and an inner end connected to an electrically conductive member. The rigid substrates positioned at both ends of the substrate block are arranged to mount connectors, respectively. The electronic control device is accommodated in a casing in the condition that these connectors can be coupled with the connectors of the external connection objects.

Therefore, the electronic control device according to the present invention brings the effect of reducing overall size of the substrate block because respective rigid substrates are laminated via flexibly bendable portions (i.e. electrically conductive members) so as to arrange a three-dimensional structure. Furthermore, using two separate connectors respectively mounted on the rigid substrates positioned at both ends of the substrate block brings the effect of downsizing the connector and also reducing the size (area) of each rigid substrate down to the level equivalent to that of the mounted connector. As a result, the electronic control device can be downsized.

The casing can be variously arranged in practice. For example, it will be possible to form an opening for introducing the substrate block from the outside into the casing. It is also possible to close this opening with a cover when the substrate block is accommodated in the casing. Furthermore, to place the connectors in positions exposed to the outside at least at the above-described portions, it is preferable that the casing has two openings provided on their side surfaces so that the connectors can be exposed from these openings and coupled with the connectors of the external connection objects.

According to a preferred embodiment of the present invention, the substrate block is folded in such a manner that an acute intersectional angle is formed between substrate planes of two neighboring rigid substrates. The rigid substrates other than two outermost rigid substrates (mounting the connectors) are positioned as inner rigid substrates of the substrate block. Two outermost rigid substrates are connected to both ends of the inner rigid substrates and disposed at mutually opposite positions with respect to substrate planes of the inner rigid substrates.

Furthermore, electronic components are mounted at least on the inner rigid substrates. And, the connectors provided on two outermost rigid substrates of the substrate block have connector pins extending outwardly and perpendicularly from substrate planes of corresponding rigid substrates.

In this case, the word "acute intersectional angle" includes 0°. More specifically, in the case of the above-described small substrate block, an intersectional angle of 30° is formed between two substrate planes of the rigid substrates by folding this small substrate block about the electrically conductive member by the angle of 150°. Furthermore, the small substrate block must be folded by the angle of 180° about the electrically conductive member to form an intersectional angle of 0° between two substrate planes of the rigid substrates. In the latter case, respective substrate planes of the rigid substrates are positioned parallel to each other.

According to this arrangement, the substrate block becomes compact and the electronic control device can be downsized. Especially, to effectively realize downsizing of the electronic control device, it is preferable that respective rigid substrates arranging the substrate block are disposed parallel to each other. In other words, the substrate planes of two neighboring rigid substrates form an intersectional angle of 0°.

The total number of the rigid substrates arranging the substrate block is arbitrary determined. However, it is preferable that the substrate block consists of an even number of rigid substrates. When all of the rigid substrates arranging the substrate block are developed on the same plane, connector pins can protrude and extend in the same direction from the connectors mounted on the rigid substrates positioned at both ends of the substrate block. In other words, in the developed condition, two connectors of the substrate block are positioned on the same plane. Accordingly, it becomes possible to simplify mounting processes of the connectors as well as manufacturing processes of the electronic control device.

Regarding the electrically conductive member serially connecting two neighboring rigid substrates, it is for example possible to use a bus bar or a flat wire, or any other member capable of providing adequate electrical connection between two rigid substrates. For example, the electrically conductive members are flexible substrates.

The flexible substrates are easily bendable and accordingly bring the effect of enabling the substrate block to easily realize a three-dimensional arrangement. Furthermore, for a high-density wiring arrangement, many wiring patterns can be formed on a small surface area of the flexible substrate. Thus, it becomes possible to not only realize the high-density wiring arrangement but also downsize the electrically conductive member.

Connection of the flexible substrate and the rigid substrate is, for example, realized by solder joint or thermocompression bonding. For example, it is preferable that the substrate block is a circuit substrate including the rigid substrates and the flexible substrates which are integrated together.

This arrangement requires no connection area between the rigid substrate and the flexible substrate (i.e. connection margin) and accordingly the overall size of the electronic control device can be reduced. For example, the circuit substrate is a batch lamination substrate including a thermoplastic resin base material.

This kind of batch lamination substrate is generally referred to as PALUP (Patterned Prepreg Lay Up Process) substrate, according to which wiring patterns are formed on each thermoplastic resin base material and then a predetermined number of these pattern formed base materials are laminated and pressed simultaneously to form a multilayered structure. This substrate is preferably applicable to high-density mounting devices, and is easily recyclable because resin components can melt when the base materials are heated. Furthermore, integral formation of the rigid substrate and the flexible substrate can be simply realized by changing the number of laminated layers.

Furthermore, according to the present invention, it is preferable that the casing has a plurality of partition plates dividing an inside space of the casing into a plurality of small spaces for accommodating the rigid substrates.

According to this arrangement, one small space accommodates one rigid substrate. Respective small spaces are separated by the partition plates so that respective rigid substrates cannot contact with each other. Thus, it becomes possible to eliminate malfunction of the electronic circuits formed on the substrate block.

In this case, it is further preferable that respective partition plates have end portions facing to an inner surface of the casing to define guide passages for guiding the electrically conductive members introduced into the casing, and the small spaces and the guide passages cooperatively form a continuous extending space in the casing.

More specifically, respective small spaces are not completely independent spaces. Two small spaces accommodating two neighboring rigid substrates are spatially connected with each other via a guide passage defined by the end portion of the partition plate intervening between these small spaces. As a result, all of the small spaces are serially connected via guide passages to form a continuously extending space.

Therefore, according to this arrangement, assembling the substrate block into the casing is easily accomplished by inserting the substrate block into the above-described continuous space of the casing. Thus, assembling of the electronic control device can be simplified.

Furthermore, according to the present invention, it is preferable that respective partition plates have recesses formed at portions facing to electronic components mounted on the rigid substrates.

This arrangement realizes high-density accommodation of the rigid substrates as well as compact accommodation of the substrate block, and accordingly realizes effective downsizing of the electronic control device. For example, it is preferable that the respective partition plates are integrally assembled with the substrate block and detachable from the casing.

According to this arrangement, the substrate block is assembled with the partition plates beforehand, and then the assembly of the substrate block and the partition plates is installed as one block into the casing. Thus, workability can be improved in assembling the substrate block as well as in accommodating it into the casing.

Furthermore, according to the present invention, it is preferable that the casing and the respective partition plates are made of metal materials. According to this arrangement, the accommodating space for the substrate block is substantially entirely surrounded by metal members. This is effective in realizing uniform temperature distribution in the electronic control device.

Furthermore, according to the present invention, it is preferable that a heater component serving as a heat-generating electronic component is mounted on at least one of the rigid substrates other than two rigid substrates positioned at both ends of the substrate block, and the heater component is brought into contact with the partition plate via a member having thermal conductivity higher than that of air.

This arrangement can reduce a heat resistance between the heating element and the partition plate and accordingly the heat dissipation efficiency of the heating element can be improved. Thus, it becomes possible to effectively release or discharge the heat of the heater component from the casing to the outside. As a result, it becomes possible to suppress the temperature increase in the casing. Regarding the member having thermal conductivity higher than that of air, it is for example possible to use heat dissipation gel or heat dissipation sheet generally used in the field of electronic devices.

For example, the heater component is a packaged component including a semiconductor chip having an active face and a silicone face provided on mutually opposed surfaces thereof, and the silicone face is exposed as a heat dissipation plane. According to this arrangement, the heat generating from the semiconductor chip can be efficiently transmitted from the silicone face to the above-described member (i.e. the member having thermal conductivity higher than that of air). Thus, this arrangement brings the effect of suppressing temperature increase in the casing.

Regarding the connection between the rigid substrate mounting the connector and the rear end of each connector pin, it will be generally possible to insert rear ends of respective connector pins into through-holes provided on the rigid substrate and then fix the land of each through-hole and the inserted connector pin with solder or silver paste or any other electrically conductive material. However, the following arrangement makes it possible to omit the connecting process using solder or other electrically conductive material.

Namely, according to the present invention, it is preferable that two rigid substrates positioned at both ends of the substrate block have through-holes into which connector pins are inserted, and electric connection between the rigid substrates and the connector pins are provided by press-fitting rear ends of the connector pins into the through-holes formed on corresponding rigid substrates.

According to this arrangement, the connecting process using solder or other electrically conductive material is unnecessary. The mounting process of the connector can be simplified. Furthermore, the rigid substrates and the connectors are free from heat stress because the press-fitting operation requires no heating treatment.

In the case of press-fitting operation, it is preferable to arrange two rigid substrates positioned at both ends of the substrate block so as to mount the connectors only. Namely, while the connectors are mounted on the outermost rigid substrates of the substrate block, all of the electronic components are mounted on the inner rigid substrates other than the outermost rigid substrates mounting the connectors.

According to this arrangement, the stress causing distortions in the process of inserting the connector pins is limited in the regions of the outermost rigid substrates mounting the connectors. No adverse influence is given to the electronic components mounted on the inner rigid substrates. Thus, the connectors can be surely mounted.

Furthermore, according to the present invention, it is preferable that the electronic control device is installed in an automotive vehicle. One connector coupled with one of the connectors mounted on two rigid substrates positioned at both ends of the substrate block is connected to a device positioned in an engine room. And, the other connector coupled with the other of the connectors mounted on two rigid substrates positioned at both ends of the substrate block is connected to a device positioned in a passenger compartment.

As described above, there is the tendency that the space available for electronic control devices is reducing in recent automotive vehicles. The number of connector pins required for an electronic control device is increasing. Hence, the electronic control device according to the present invention can be preferably used as an electronic control device installed in an automotive vehicle. Furthermore, the connection object of one connector is a device positioned in an engine room, and the connection object of other connector is a device positioned in a passenger compartment. Thus, the electronic control device is installed in such a manner that respective connectors can face toward their connection objects. The wiring (e.g. wiring harness or the like) between the electronic control device and other devices can be shortened and efficiently provided.

In this case, it is preferable that the automotive vehicle has a partition wall for separating the engine room from the passenger compartment. And, the electronic control device is provided on the partition wall in such a manner that one of the connectors mounted on two rigid substrates is exposed to the engine room and the other of the connectors mounted on two rigid substrates is exposed to the passenger compartment.

According to this arrangement, it is not necessary to provide the wiring (e.g. wiring harness or the like) penetrating the partition wall to connect the electronic control device with other devices. The workability can be improved in arranging the wiring. Furthermore, the surface of the electronic control device is partly exposed to the passenger compartment. It becomes possible to relax the loading environment, compared with a case that the electronic control device is entirely disposed in the engine room.

Furthermore, in the case of installing the electronic control device on the partition wall, it is preferable that the electronic control device is arranged in such a manner that a surface area of a portion exposed to the passenger compartment is larger than a surface area of a portion exposed to the engine room. This arrangement is effective in relaxing the loading environment (especially, temperature environment).

Furthermore, in the case of installing the electronic control device on the partition wall, it is preferable that a heat insulating material is provided on the surface of a portion exposed to the engine room, and the heat insulating material has thermal conductivity lower than that of air.

This arrangement brings the effects of suppressing heat transfer from the engine room to the inside of the electronic control device and also decreasing the temperature of the electronic control device to a lower level equivalent to the temperature of the passenger compartment.

In general, there is the possibility that water enters into the engine room of an automotive vehicle from the outside. Therefore, it is necessary to provide a water-proof arrangement at least at a portion of the electronic control device positioning in the engine room for protecting the electronic control device against water. On the other hand, it is necessary to provide a water-proof arrangement to the portion positioning in the passenger compartment because no water usually enters into the passenger compartment from the outside.

Furthermore, if the electronic control device is entirely processed to have a water-proof arrangement before it is placed in the engine room, it will be necessary to provide a pressure regulating filter (e.g. an air-permeable and water-impermeable filter) between the inside space of the electronic control device and the outside to relax or eliminate the pressure difference caused in accordance with the temperature difference.

In this case, it is preferable that the electronic control device is arranged to have an air-permeable clearance spatially connecting an inside space of the casing to the passenger compartment in a condition that the substrate block is accommodated in the casing.

According to this arrangement, it becomes possible to eliminate the pressure difference between the passenger compartment and the inside space of the electronic control device (i.e. the space accommodating the substrate block). Thus, no pressure regulating filter is required. The electronic control device can be simplified in structure and manufactured at low costs.

Hereinafter, practical embodiments of the present invention will be explained with reference to attached drawings. The electronic control device explained in each embodiment is, for example, installed in an automotive vehicle as a vehicular electronic control device for controlling an engine of this automotive vehicle.

First Embodiment

FIG. 1 is a plan view showing an electronic control device 1 in accordance with a first embodiment of the present invention. The electronic control device 1 includes a circuit substrate 3 (not shown in FIG. 1. refer to FIGS. 4 and 5) on which two connectors (i.e. engine room connector 5 and passenger compartment connector 6) are mounted, a metal-made casing 2 accommodating this circuit substrate 3, and a resin-made cover 4 closing an upper opening of this casing 2.

The casing 2 has a portion closed with the cover 4, i.e. an upper opening, which is opened when the circuit substrate 3 is accommodated into the casing 2 from the outside. The casing 2 has other openings where respective connectors 5 and 6 are disposed, which are referred to as "side openings" hereinafter. These side openings are closed with respective connectors 5 and 6 when the circuit substrate 3 is accommodated in the casing 2.

Furthermore, a total of four flanges 7 are provided on side surfaces of the casing 2 (although FIG. 1 shows only two). The electronic control device 1 is fixed to a partition wall 60 by means of screws 35 inserted into holes of these flanges 7. As shown in later-explained FIGS. 7 and 8, the partition wall 60 is provided in the automotive vehicle to separate an engine room from a passenger compartment.

Figure 2:
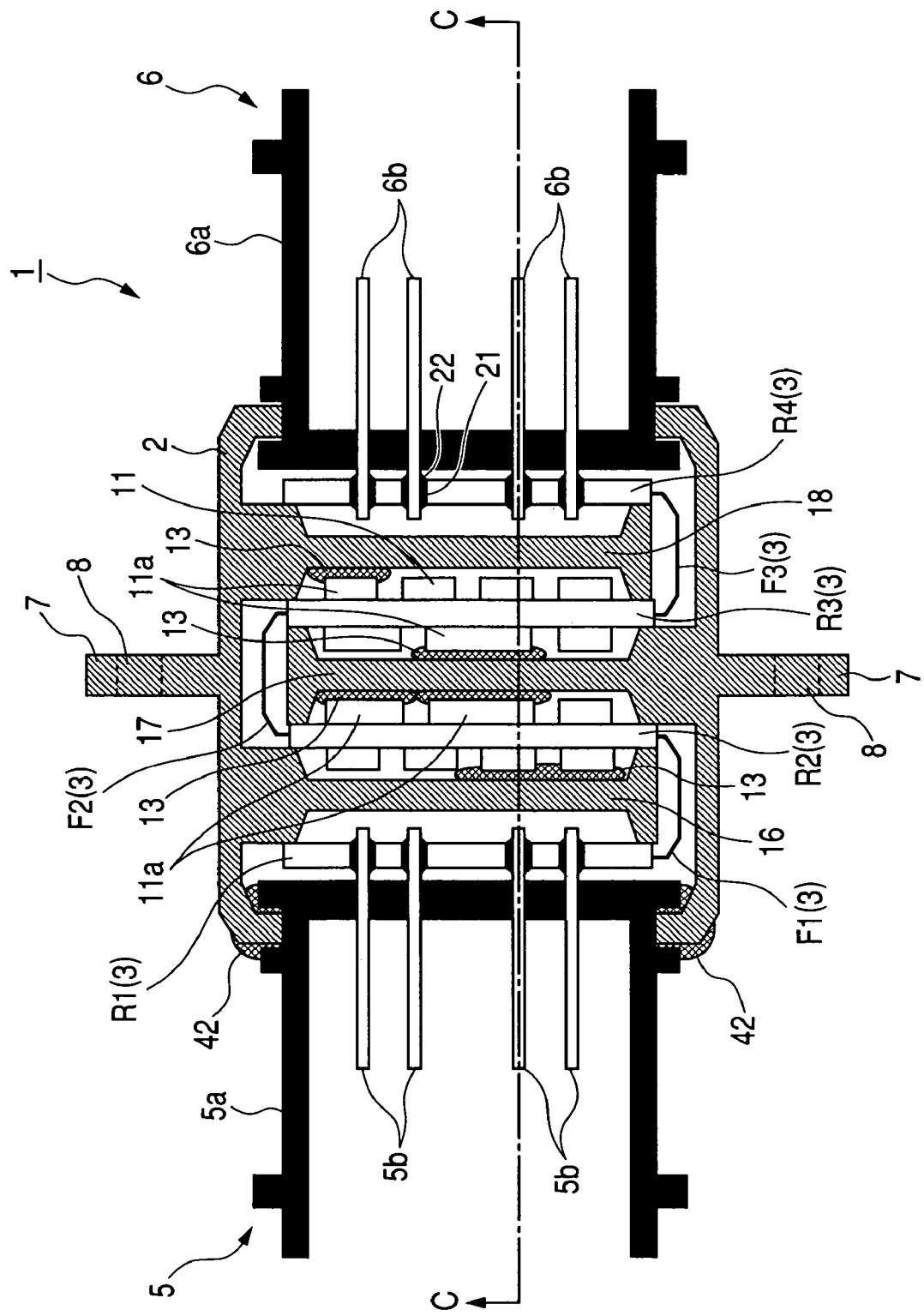
FIG. 2 is a cross-sectional view showing an inside arrangement of the electronic control device in accordance with the first embodiment of the present invention, taken along a line A-A of FIG. 1.
Figure 3:
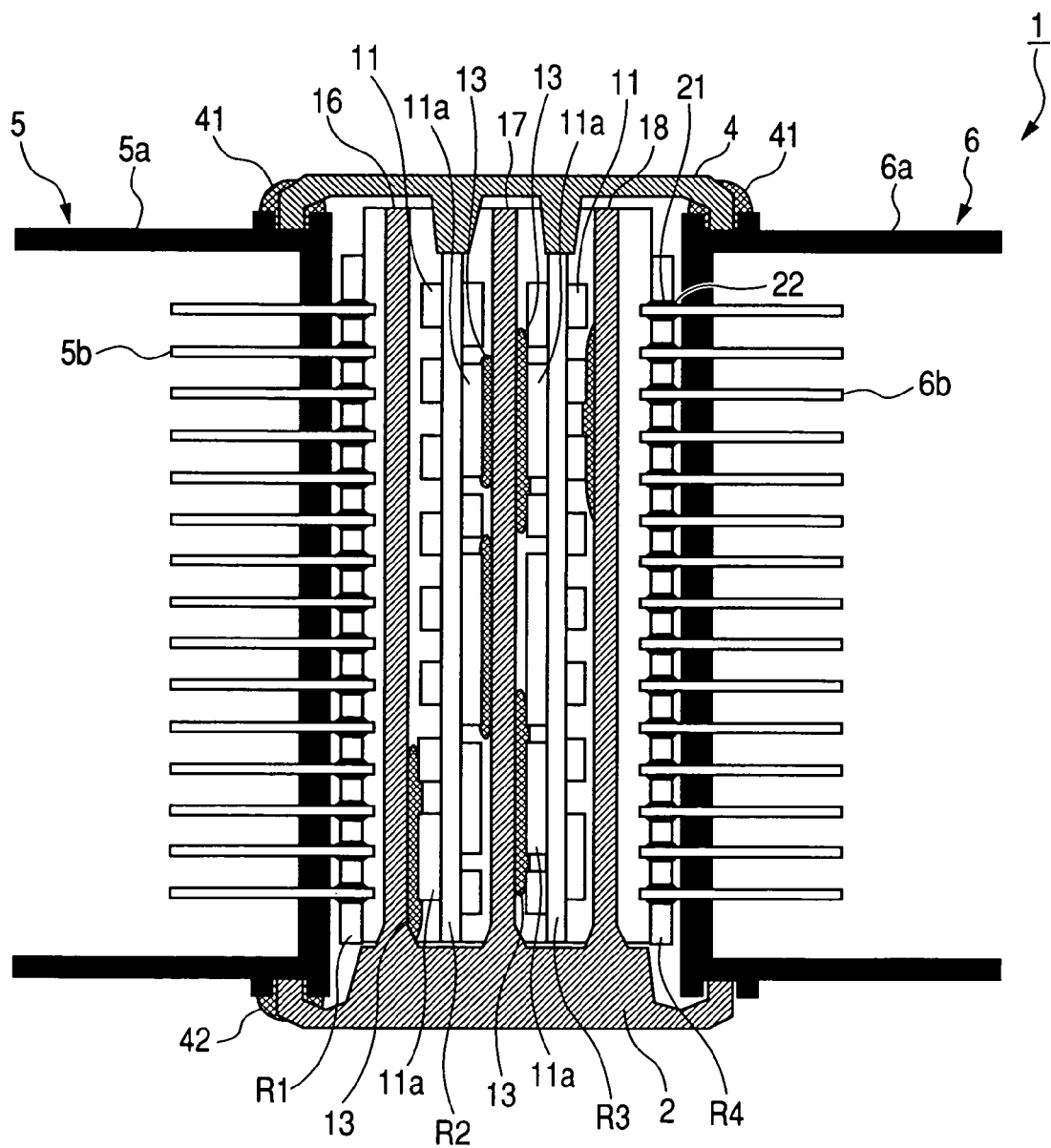
FIG. 3 is a cross-sectional view showing an inside arrangement of the electronic control device in accordance with the first embodiment of the present invention, taken along a line C-C of FIG. 2.

The inside arrangement of the electronic control device 1 will be explained in more detail. FIGS. 2 and 3 are cross-sectional views showing the inside arrangement of the electronic control device 1. FIG. 2 is a cross-sectional view showing the inside arrangement of the electronic control device 1, taken along a line A-A of FIG. 1. FIG. 3 is a cross-sectional view showing the inside arrangement of the electronic control device 1, taken along a line C-C of FIG. 2. To explicitly discriminate the circuit substrate 3 from the casing 2, the illustration of FIGS. 2 and 3 intentionally omit the hatching to be added to the cross-sectional portions of respective rigid portions R1 to R4 and electronic components 11 or heater components 11a.

FIGS. 2 and 3 show the electronic control device 1 in a condition that the circuit substrate 3 is accommodated in the casing 2 and closed with the cover 4. FIGS. 4A and 4B show the circuit substrate 3 taken out of the casing 2. Namely, the illustration of FIG. 4 is different from the cross-sectional view of FIG. 2 in that the casing 2 and the circuit substrate 3 are separated from each other.

As shown in FIG. 4A, the casing 2 has three partition plates 16, 17, and 18 integrally formed inside thereof. These partition plates 16, 17, and 18 divide the inside space of the casing 2 into a plurality of (i.e. four) small spaces 26, 27, 28, and 29. In FIG. 4A, alternate long and two short dashes lines show boundaries between the inside space of the casing 2 and respective connectors 5 and 6 in the condition that the circuit substrate 3 is accommodated in the casing 2. In FIG. 4A, the small space 26 is a space defined between a left alternate long and two dashes line and the partition plate 16, while the small space 29 is a space defined between a right alternate long and two short dashes line and the partition plate 18.

Furthermore, the partition plate 16 has a flattened distal end facing to the inner surface of the casing 2 to define a guide passage 16a for guiding an inserted flexible portion F1. Other partition plates 17 and 18 have similar arrangements. The partition plate 17 has a flattened distal end to define a guide passage 17a, and the partition plate 18 has a flattened distal end to define a guide passage 18a. Accordingly, the above-described small spaces 26 to 29 and respective guide passages 16a, 17a, and 18a cooperatively form a continuously extending space (hereinafter, referred to as "circuit substrate introducing space").

On the other hand, the circuit substrate 3 (i.e. a substrate block of the present invention) consists of flexible portions having appropriate flexibility and rigid portions having lower flexibility compared with the flexible portions (practically, the rigid portions are hard members having no flexibility). More specifically, as shown in FIG. 4B or in FIGS. 5A and 5B, the circuit substrate 3 consists of four rigid portions (i.e. rigid substrates of the present invention) R1, R2, R3, and R4 and three flexible portions (i.e. flexible substrates of the present invention) F1, F2, and F3 which are integrated into one circuit substrate.

FIG. 4B shows the condition of circuit substrate 3 accommodated in the casing 2. Furthermore, FIG. 5A is a plan view and FIG. 5B is a front view respectively showing the rigid portions R1 to R4 of the circuit substrate 3 developed on the same plane from the condition shown in FIG. 4B.

More specifically, according to the circuit substrate 3 of this embodiment, the rigid portion R1 and the rigid portion R2 are electrically (and mechanically) connected via the flexible portion F1. The rigid portion R2 and the rigid portion R3 are electrically (and mechanically) connected via the flexible portion F2. The rigid portion R3 and the rigid portion R4 are electrically (and mechanically) connected via the flexible portion F3. Respective flexible portions extend from long sides of the rigid portions.

Among respective rigid portions arranging the circuit substrate 3, the rigid portion R1 positioned at one end of the circuit substrate 3 mounts an engine room connector 5. The rigid portion R4 positioned at the other end of the circuit substrate 3 mounts a passenger compartment connector 6.

The engine room connector 5 consists of a resin-made connector housing 5a and a plurality of connector pins 5b. Respective connector pins 5b, provided on the bottom of connector housing 5a, extend perpendicularly from the bottom of connector housing 5a. Each connector pin 5b has a rear end inserted into a through-hole 21 formed on the rigid portion R1 and fixed with a solder 22. When this engine room connector 5 is mounted on the rigid portion R1, respective connector pins 5b are positioned perpendicularly to the plane of the rigid portion R1.

Similarly, the passenger compartment connector 6 consists of a resin-made connector housing 6a and a plurality of connector pins 6b. Respective connector pins 6b, provided on the bottom of connector housing 6a, extend perpendicularly from the bottom of connector housing 6a. Each connector pin 6b has a rear end inserted into a through-hole 21 formed on the rigid portion R4 and fixed with a solder 22. When this passenger compartment connector 6 is mounted on the rigid portion R4, respective connector pins 6b are positioned perpendicularly to the plane of the rigid portion R4.

Among respective rigid portions R1 to R4 arranging the circuit substrate 3, the rigid portions R2 and R3 correspond to inner rigid substrates of the present invention and are discriminated from the outermost rigid portions R1 and R4 mounting the connectors 5 and 6.

Furthermore, the circuit substrate 3 according to this embodiment is a multilayered flexible substrate (referred to as a multilayered rigid flexible substrate) including a polyimide base material used in general consumer goods.

Figure 9:
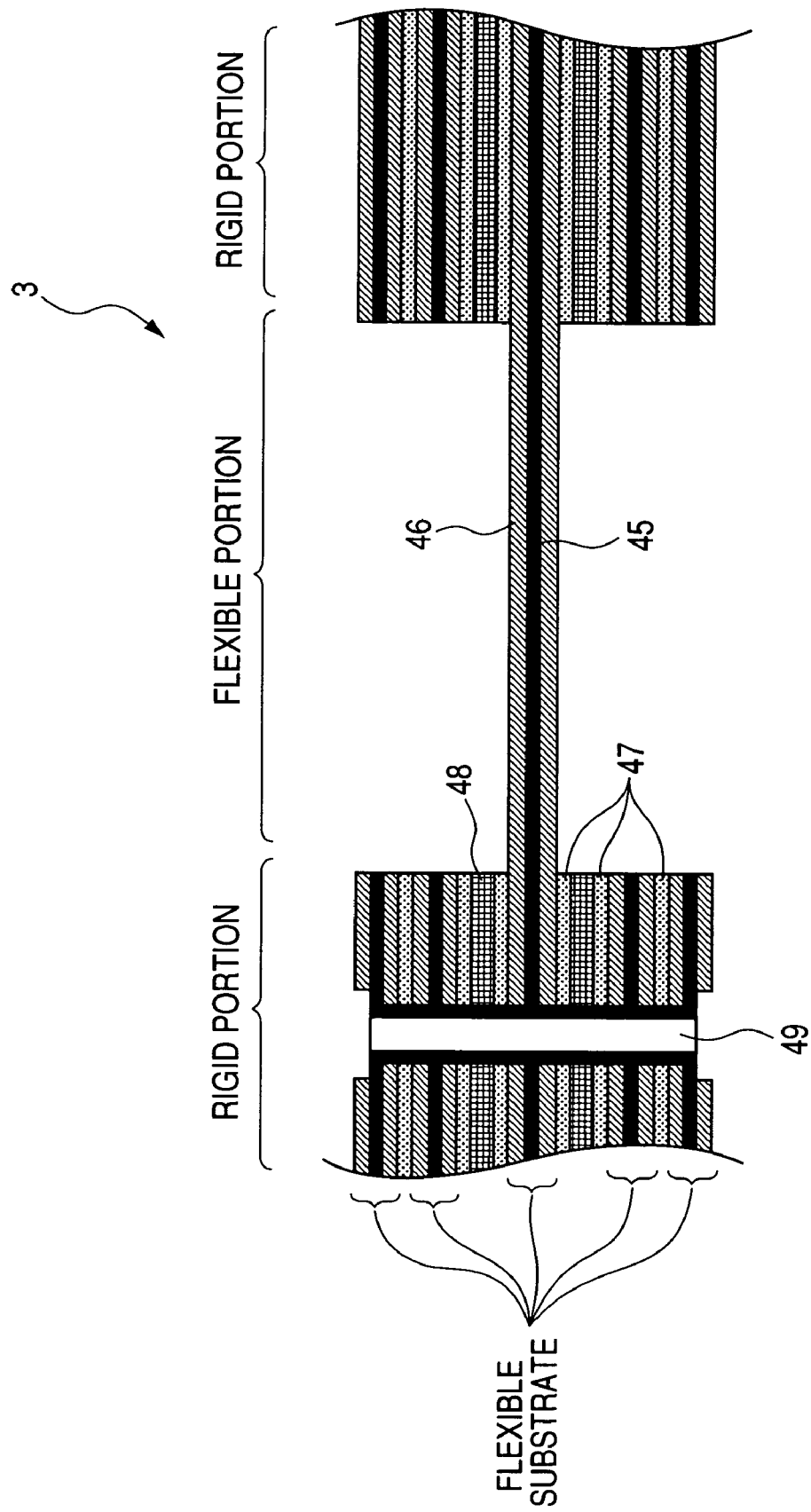
FIG. 9 is a cross-sectional view showing a multilayered flexible substrate having a polyimide base material in accordance with the first embodiment of the present invention.

This kind of multilayered flexible substrate, as shown in FIG. 9, includes a plurality of flexible substrates laminated via interlayer adhesives 47. Each flexible substrate is arranged as a single-layer structure consisting of a wiring conductor 45 made of a copper foil sandwiched between coverlay films 46 made of a flexible polyimide. The portion where only one single-layer flexible substrate is present serves as a flexible portion. The portion where a prepreg (i.e. a molding intermediate material containing carbon fibers impregnated in a resin) 48 is assembled together with a plurality of flexible substrates by a buildup technique serves as a rigid portion. In FIG. 9, the rigid portion has a through-hole 49 extending vertically across the multilayered substrates to provide electrical connection between wiring conductors 45 of respective layers.

When the circuit substrate 3 is accommodated in the casing 2, respective flexible portions F1 to F3 of the circuit substrate 3 are folded by the angle of 180° so that respective rigid portions R1 to R4 are disposed in parallel with each other as shown in FIG. 4B. In other words, two neighboring rigid portions are disposed so as to form an intersectional angle of 0° between their planes. With this arrangement, respective rigid portions R1 to R4 are serially connected via folded flexible portions F1 to F3 to form a three-dimensional structure. Furthermore, connector pins 5b and 6b of respective connectors 5 and 6 extend in the mutually opposed directions (i.e. directions different by 180°).

When the circuit substrate 3 is inserted along the circuit substrate introducing space in the casing 2 (refer to FIG. 4A), the side openings of the casing 2 are just closed with the connectors 5 and 6 respectively. More specifically, the rigid portion R1 is accommodated in the small space 26. The flexible portion F1 is positioned in the guide passage 16a. The rigid portion R2 is accommodated in the small space 27. The flexible portion F2 is positioned in the guide passage 17a. The rigid portion R3 is accommodated in the small space 28. The flexible portion F3 is positioned in the guide passage 18a. The rigid portion R4 is accommodated in the small space 29.

FIGS. 2 and 3 respectively show the folded condition of the circuit substrate 3 accommodated in the casing 2. Almost all of respective connectors 5 and 6 are exposed out of the casing 3 of the electronic control device 1.

As shown in FIG. 2, electronic components 11 forming an electronic circuit are mounted on respective rigid portions R2 and R3 (i.e. the inner rigid substrates arranging the circuit substrate 3) with solder or silver paste, or any other electrically conductive material. The electronic components 11 include some electronic components (i.e. heater components) 11a which generate heat in accordance with electric power consumption. On the other hand, as shown in FIG. 4A, recesses 16b, 17b, and 18b are formed on respective partition plates 16, 17, and 18 of the casing 2. Providing these recesses 16b, 17b, and 18b makes it possible to accommodate the electronic components mounted on respective rigid portions R1 to R4 in the spaces defined by these recesses 16b, 17b, and 18b (refer to FIG. 2). Thus, the casing 2 becomes compact in the height direction of the electronic components 11.

The clearances between respective heater components 11a and respective partition plates 16, 17, and 18 are filled with heat dissipation gel 13. The material of respective partition plates 16 to 18 is a metal. Furthermore, respective connectors 5 and 6 are provided with recesses extending entirely on their side surfaces, so that the connectors 5 and 6 can be detachably coupled with the casing 2. To realize a water-proof arrangement, the engine room connector 5 is coupled into the recess with appropriate silicone adhesive 42. As shown in FIG. 3, a recess is provided on the upper portion of the casing 2 (i.e. around the upper opening) to couple with the cover 4. To realize a water-proof arrangement, the cover 4 is coupled into this recess with appropriate silicone adhesive 41.

As shown in FIG. 2, above-described water-proof arrangement is not employed for the recess (i.e. the portion to be coupled with the casing 2) provided on the passenger compartment connector 6. The passenger compartment connector 6 is positioned in a passenger compartment and accordingly no water-proof arrangement is required. In other words, there is an air-permeable clearance spatially connecting the inside space of the casing 2 (i.e. circuit substrate introducing space) to the passenger compartment.

Figure 6:
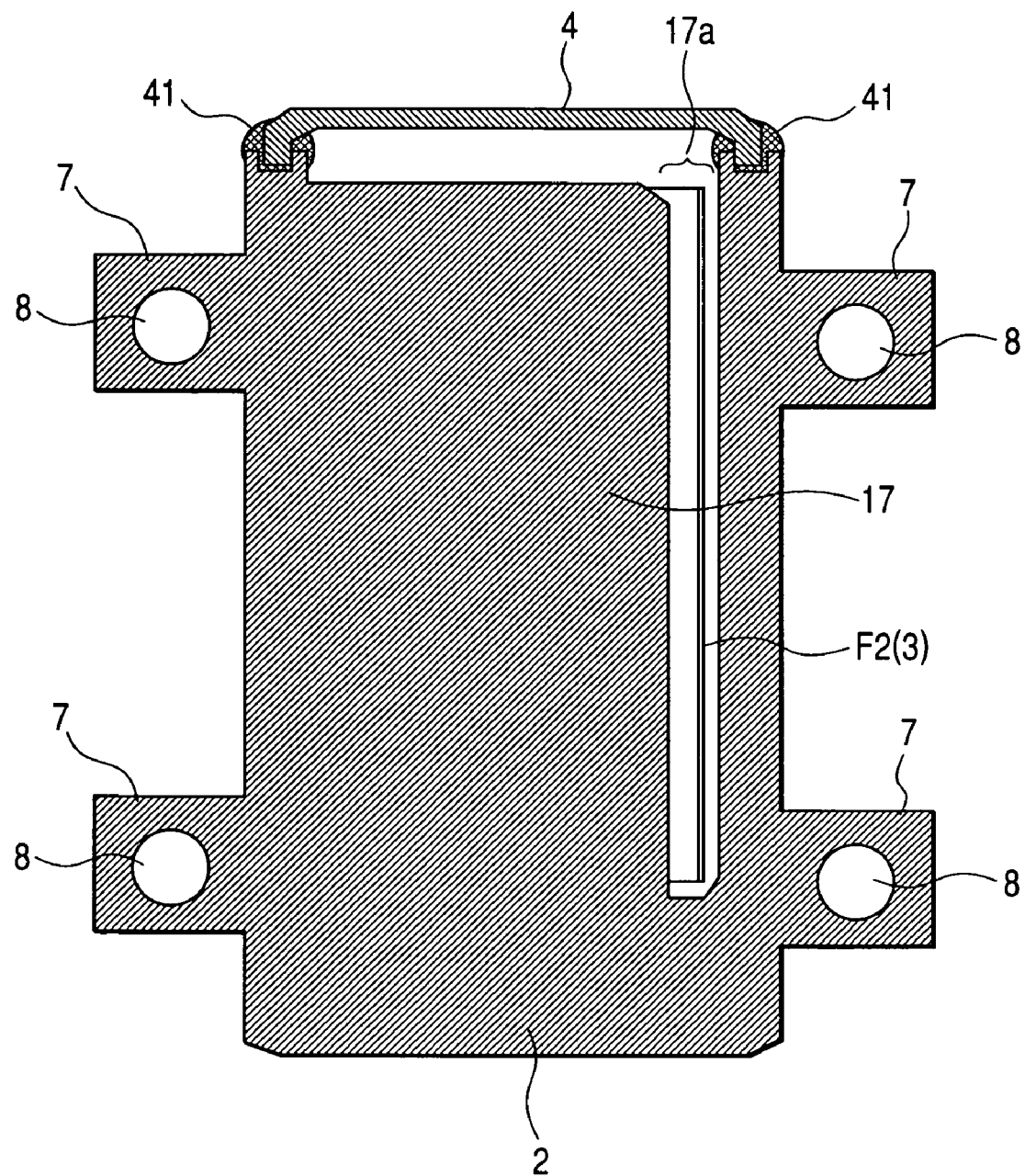
FIG. 6 is a cross-sectional view showing an inside arrangement of the electronic control device in accordance with the first embodiment of the present invention, taken along a line B-B of FIG. 1.

FIG. 6 is a cross-sectional view showing the electronic control device 1, taken along a line B-B of FIG. 1. As shown in this drawing, a total of four flanges 7 are provided on the outer surface of the casing 2. Each flange 7 has a screw hole 8 opened for introducing a screw. Furthermore, as described above, the guide passage 17a is formed between the partition plate 17 and the inner surface of the casing 2, so that the flexible portion F2 is inserted along the guide passage 17a.

Figure 7:
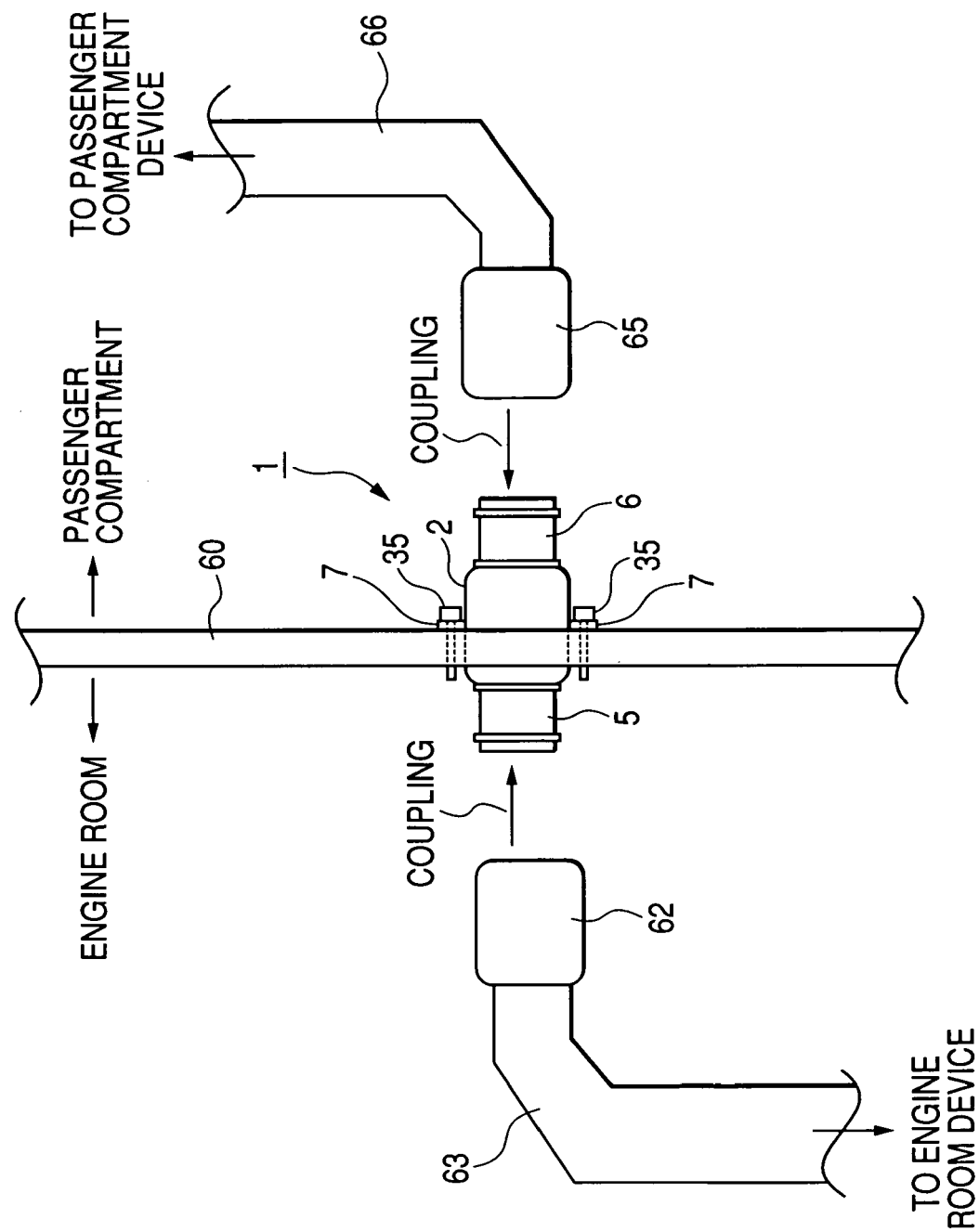
FIG. 7 is a view showing the electronic control device installed on a partition wall of an automotive vehicle separating an engine room from a passenger compartment in accordance with the first embodiment of the present invention.

The electronic control device 1 having the above-described arrangement is supported on the partition wall 60 of an automotive vehicle as shown in FIG. 7, so as to extend across the partition wall 60 from the passenger compartment to the engine room.

Figure 8:
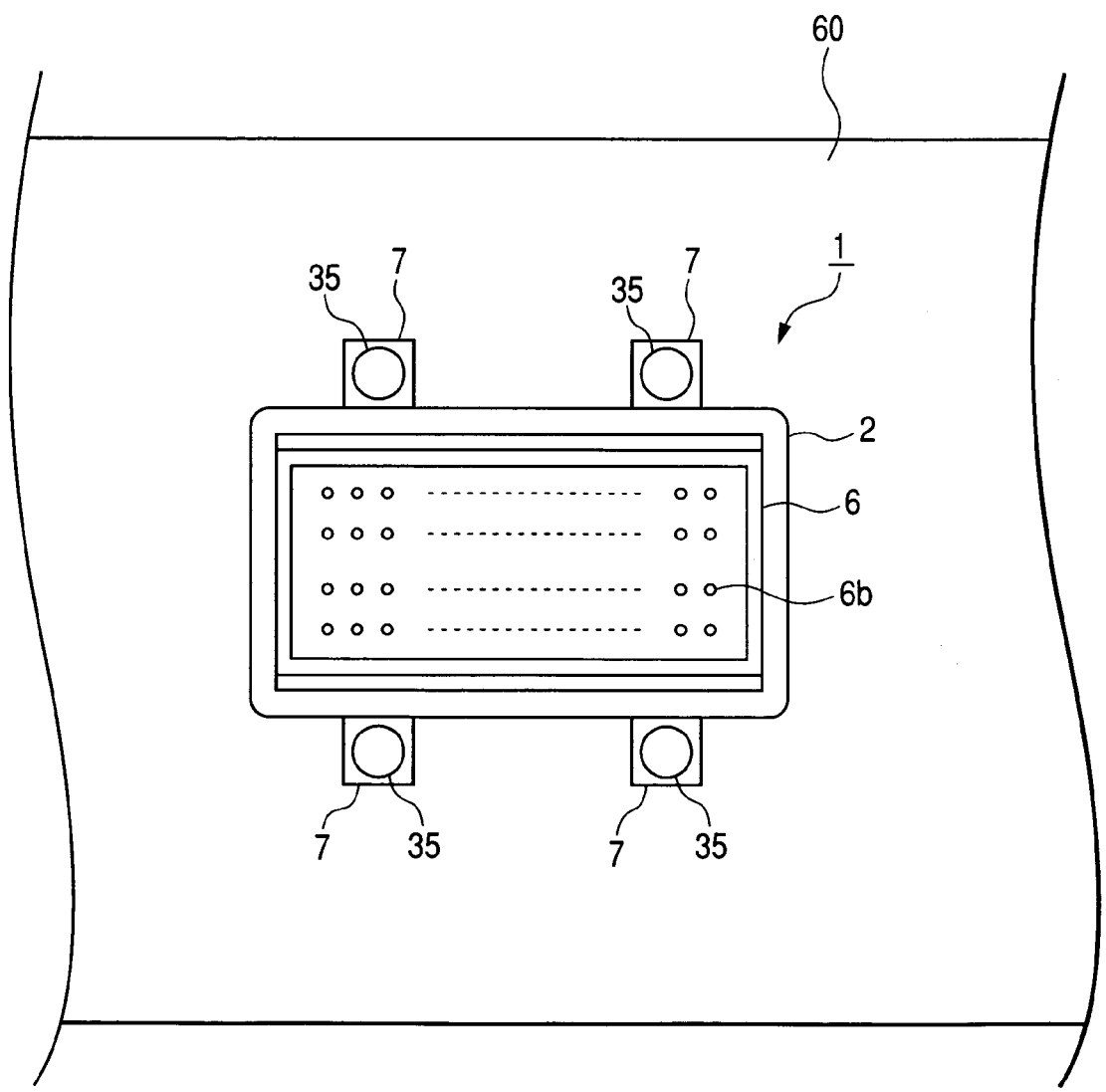
FIG. 8 is a view showing the electronic control device shown in FIG. 7, seen from the passenger compartment.

More specifically, the partition wall 60 has a hole (not shown) corresponding to the casing 2. The electronic control device 1 is inserted into the hole of the partition wall 60 from the passenger compartment. In the condition that respective flanges 7 of the casing 2 are brought into contact with the partition wall 60, the screws 35 are firmly fastened into the screw holes 8 of respective flanges 7 as well as screw holes (not shown) provided on the partition wall 60. Accordingly, the electronic control device 1 is firmly fixed on the partition wall 60 with these four screws 35. FIG. 8 shows the electronic control device 1 fixed on the partition wall 60, which is seen from the passenger compartment.

As a result of the above-described installation of the electronic control device 1 onto the partition wall 60, the engine room connector 5 is exposed to the engine room while the passenger compartment connector 6 is exposed to the passenger compartment. Furthermore, the electronic control device 1 can be inserted from the passenger compartment when it is installed on the partition wall 60. Therefore, the surface area of the electronic control device 1 exposed to the engine room is smaller than the surface area of the electronic control device 1 exposed to the passenger compartment.

In the condition that the electronic control device 1 is fixed (i.e. installed) to the partition wall 60, the engine room connector 5 is coupled with a connector 62 of a device positioned in the engine room (i.e. a connector of the connection object) via a wiring harness 63 so as to establish electrical connection between the electronic control device 1 and this connection object in the engine room device. Furthermore, the passenger compartment connector 6 is coupled with a connector 65 of a device positioned in the passenger compartment (i.e. a connector of the connection object) via a wiring harness 66 so as to establish electrical connection between the electronic control device 1 and this connection object in the passenger compartment.

According to the above-described electronic control device 1 in accordance with this embodiment, the circuit substrate 3 is arranged as a multilayered flexible substrate consisting of a plurality of rigid portions R1 to R4 and a plurality of flexible portions F1 to F3 which are integrated together. Respective flexible portions F1 to F3, each being folded by 180°, are accommodated in the casing 2. The rigid portions R1 and R4 positioned at both ends of the circuit substrate 3 mount only the connectors 5 and 6, respectively. Respective connectors 5 and 6, in the condition that they are accommodated in the casing 2, protrude and extend in mutually opposite directions. Accordingly, the circuit substrate 3 becomes compact and accordingly the electronic control device 1 can be downsized.

Furthermore, folding respective flexible portions F1 to F3 by 180° in this manner brings the effect of adequately assuring vibration-proof properties due to elasticity of respective flexible portions F1 to F3. Thus, it is not necessary to completely fix respective rigid portions R1 to R4 in the casing 2. If it is necessary to further improve the vibration-proof properties, it will be for example preferable to partly provide adhesive between the circuit substrate 3 and the bottom of the casing 2, or between the circuit substrate 3 and respective partition plates 16 to 18.

Using two divided connectors 5 and 6 brings the effect of reducing the overall connector size and suppressing required coupling forces of respective connectors 5 and 6. Especially, using the divided connectors is effective when a great number of connector pins are required for the electronic control device.

Furthermore, the inside space of the casing 2 has a plurality of small spaces 26, 27, 28, and 29 divided by the partition plates 16, 17, and 18. These small spaces can accommodate respective rigid portions R1 to R4 so as to prevent respective rigid portions R1 to R4 from contacting with each other, thereby preventing malfunction of the electronic circuit formed on the circuit substrate 3. Furthermore, respective partition plates 16, 17, and 18 have recesses 16b, 17b, and 18b formed on both surfaces thereof and the distal ends defining the guide passages 16a, 16b, and 16c relative to the inner surface of the casing 2. Thus, the electronic control device 1 can be further downsized. Assembling (accommodating) work for the electronic control device 1 can be simply accomplished by inserting the circuit substrate 3 into the casing 2.

Furthermore, the casing 2 and the respective partition plates 16b, 17b, and 18b formed in this casing 2 are metal-made members. The heating elements 11a mounted on the rigid substrates R2 and R3 are brought into contact with the opposing partition plates via the heat dissipation gel 13. Accordingly, it becomes possible to realize uniform temperature distribution in the electronic control device 1. Furthermore, it becomes possible to effectively release or discharge the heat of heater components 11a from the casing 2 to the outside, and as a result it becomes possible to suppress the temperature increase in the casing 2.

It will be possible to further improve the heat dissipation properties when the heater component 11a is a packaged component including a semiconductor chip whose silicone face is exposed as a heat dissipation plane. FIG. 10 shows this kind of package including a semiconductor chip 51 mounted on a package substrate (i.e. mother substrate) 53 by flip chip connection. Namely, according to this package, the semiconductor chip 51 has an active face 51a facing down toward the package substrate 53. The electric connection between the semiconductor chip 51 and the package substrate 53 is provided, for example, by connecting gold bumps 52 of the semiconductor chip 51 to connection lands 54 of the package substrate 53. According to this package, the heat dissipation efficiency can be increased because a silicone face 51b receiving most of heat generated from the semiconductor chip 51 is exposed to the front (i.e. outer) side. In FIG. 10, reference numeral 55 represents a resin-made underfill (i.e. insulating sealing material).

Furthermore, the electronic control device 1 of this embodiment is installed on the partition wall 60 of an automotive vehicle which separates the engine room from the passenger compartment, so that the engine room connector 5 is positioned in the engine room and the passenger compartment connector 6 is positioned in the passenger compartment. Furthermore, the surface area of the electronic control device 1 exposed to the passenger compartment is larger than the surface area of the electronic control device 1 exposed to the engine room is smaller than. Therefore, it is not necessary to arrange the wiring harness 63 so as to extend from the engine room to the passenger compartment beyond the partition wall 60. Furthermore, it is not necessary to arrange the wiring harness 66 so as to extend from the passenger compartment to the engine room beyond the partition wall 60. In this respect, this embodiment can realize an efficient arrangement for the wiring harnesses. The workability can be improved in laying these wiring harnesses 63 and 66. Furthermore, compared with a case that the electronic control device 1 is entirely disposed in the engine room, it becomes possible to relax the loading environment (especially, temperature environment).

Furthermore, providing the flanges 7 for the screws fastening the casing 2 to the partition wall 60 brings the effect of directly transmitting the heat of the casing 2 to the partition wall 60 and accordingly improving the heat dissipation properties.

Furthermore, the water-proof arrangement is not employed (not necessary) for the portion exposed to the passenger compartment. Hence, the inside space of the casing 2 is gas permeably connected with the passenger compartment. Accordingly, it is not necessary to provide a pressure regulating filter or the like. The electronic control device 1 can be further simplified and the manufacturing cost can be reduced.

Second Embodiment

Figure 11A:
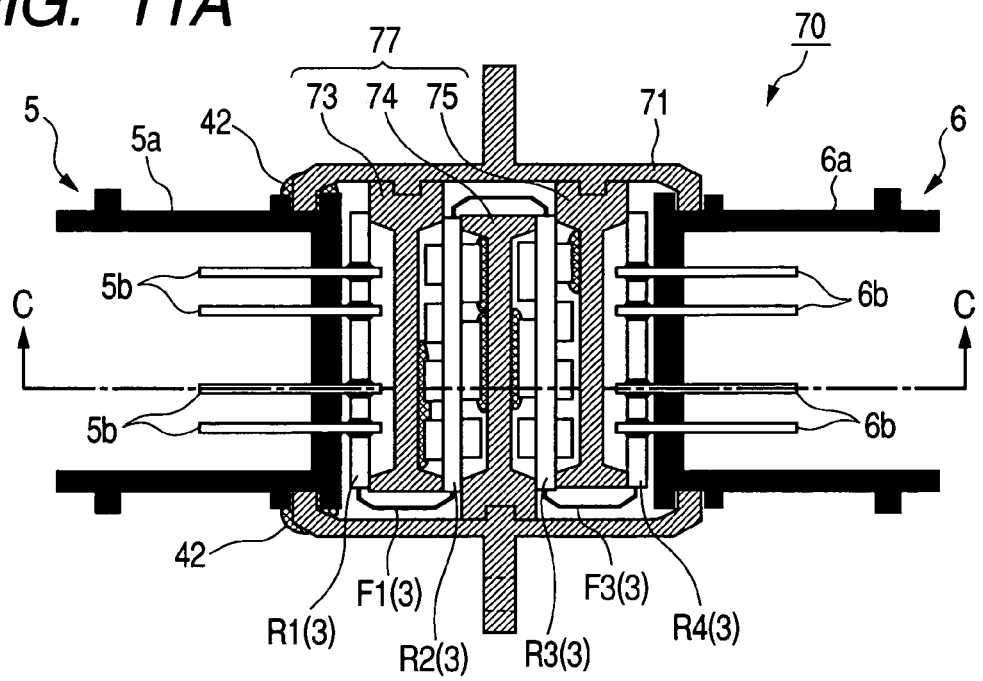
FIGS. 11A and 11B are cross-sectional views showing the inside arrangement of an electronic control device in accordance with a second embodiment of the present invention.
Figure 11B:
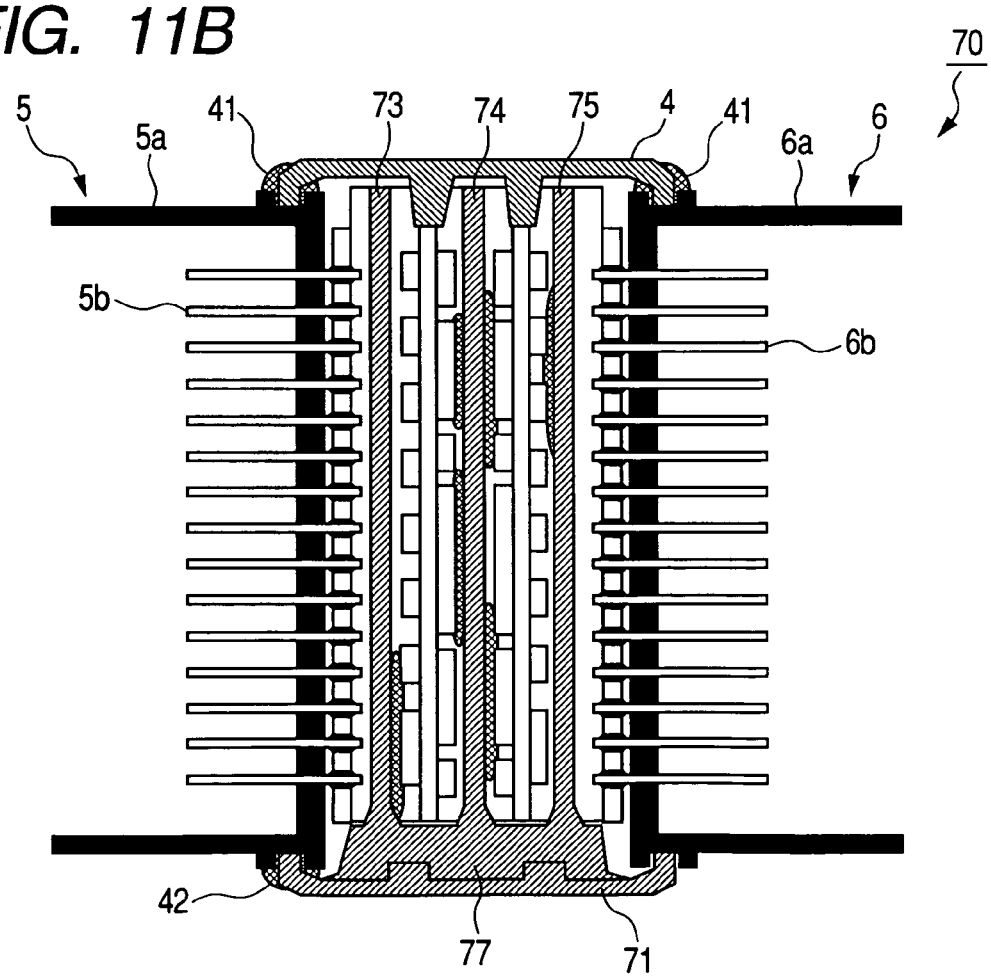

Next, an electronic control device in accordance with a second embodiment of the present invention will be explained with reference to FIGS. 11A and 11B. In FIGS. 11A and 11B, the members identical with those of the electronic control device 1 disclosed in the first embodiment are denoted by the same reference numerals. FIG. 11A is a cross-sectional view showing the electronic control device in accordance with the second embodiment, corresponding to FIG. 2 of the first embodiment (taken along the line A-A of FIG. 1). FIG. 11B is a cross-sectional view showing the electronic control device in accordance with the second embodiment, corresponding to FIG. 3 of the first embodiment (taken along the line C-C of FIG. 2).

As shown in FIGS. 11A and 11B, an electronic control device 70 of this embodiment has three separate partition plates 73, 74, and 75 integrally assembled into a single partition plate block 77, although the electronic control device 1 of the first embodiment includes partition plates 16, 17, and 18 integrally formed with the casing 2. The integrally assembled partition plate block 77 is detachable from the casing 71.

For example, installation of the circuit substrate 3 into the casing 71 is performed in the following manner. First, before installed into the casing 71, the circuit substrate 3 is assembled with the partition plate block 77 in the folded condition shown in FIG. 4B. Then, the assembly of the circuit substrate 3 and the partition plate block 77 is installed into the casing 71.

Accordingly, the workability can be improved not only in assembling the circuit substrate 3 but also in installing the assembly into the casing 71. It is however possible to accommodate (fix) the partition plate block 77 first in the casing 71 and then assemble the circuit substrate 3 with the partition plate block 77 installed in the casing 71.

Figure 12:
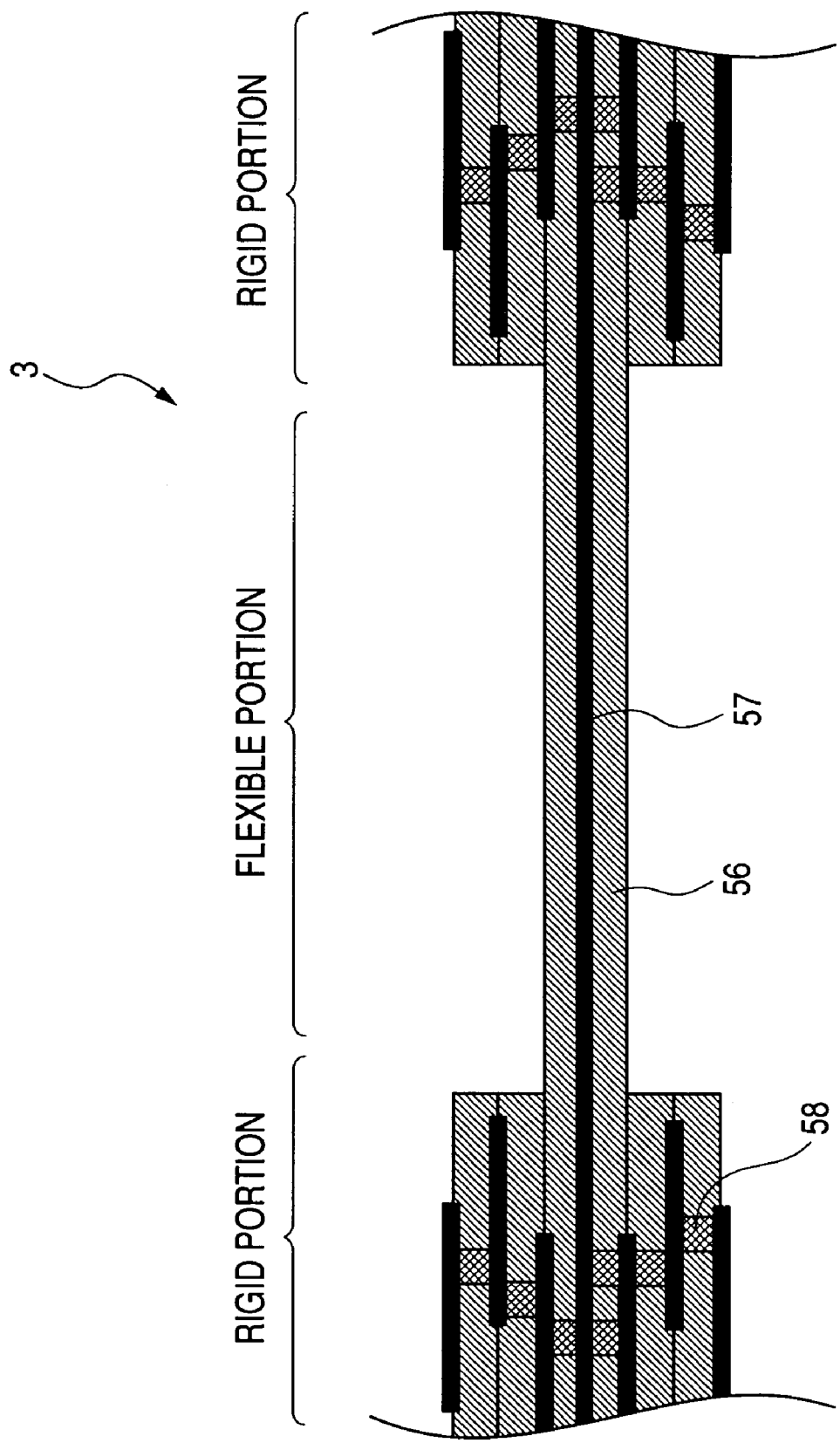
FIG. 12 is a view showing a batch lamination substrate including a thermoplastic resin base material.

Furthermore, according to this embodiment, the circuit substrate 3 is a batch lamination substrate including a thermoplastic resin base material. For example, a PALUP substrate is a representative example of this kind of batch lamination substrate. This substrate, as shown in FIG. 12, basically consists of a predetermined number of laminated base materials 56 formed with a wiring pattern 57 of a copper foil. The wiring pattern 57 is formed by etching on the surface of the thermoplastic resin base material 56. The laminated base materials 56 and the wiring patterns 57 are integrated into a multilayered substrate 3 through a thermal pressing operation. The multilayered portion of a plurality of wiring patterns 57 and the base materials 56 serves as a rigid portion. The single-layer portion consisting of one wiring pattern 57 sandwiched between a pair of base materials 56 serves as a flexible portion. In FIG. 12, via-holes 58 are formed in the rigid portion to provide electrical paths between the wiring patterns 57 of two neighboring layers of the rigid portion.

Using the batch lamination substrate including a thermoplastic resin base material brings the effect of enhancing the mounting density of electronic components. Furthermore, formation of the rigid portions and the flexible portions can be flexibly and simply realized by changing the number of laminated layers. Furthermore, recycle of this substrate can be easily realized by applying heat to melt only the resin component in the base material.

Modified Embodiments

Although the present invention is explained based on the above-described embodiments, the present invention is not limited to these embodiments and can be variously modified within the technical scope or gist of the present invention.

For example, according to the above-described embodiments, the circuit substrate 3 includes four rigid portions. However, the number of the rigid portions is not limited to a specific number and accordingly can be changed appropriately. In short, the circuit substrate of the present invention should consist of two rigid portions mounting the connectors and positioned at both ends of this circuit substrate and at least one inner rigid portion mounting electronic components.

However, in the case that circuit substrate consists of an odd number of rigid portions, the connector mounting process will be complicated because, in a condition that this circuit substrate is developed on the same plane, the connectors mounted on the rigid portions positioned at both ends of this circuit substrate inevitably extend from this plane to mutually opposite directions. This is the reason why providing an even number of rigid portions is preferable.

Furthermore, according to the above-described embodiments, the rigid portions R1 to R4 and the flexible portions F1 to F3 are integrated. However, it is possible to form the circuit substrate by separately preparing rigid portions (i.e. rigid substrates) and flexible portions (i.e. flexible substrates) and then electrically connecting them by thermocompression bonding or by soldering. Furthermore, it is possible to use bus bars or flat wires to provide electrical connection between the rigid portions instead of using the flexible portions (i.e. flexible substrates).

Furthermore, according to the above-described embodiments, the respective connectors 5 and 6 are mounted on respective rigid portions R1 and R4 by inserting the connector pins 5b (6b) into the through-holes 21 and soldering there. However, it is possible to press-fitting the connector pins into the through-holes to mount the connectors 5 and 6 to the rigid portions R1 and R4.

Figure 13:
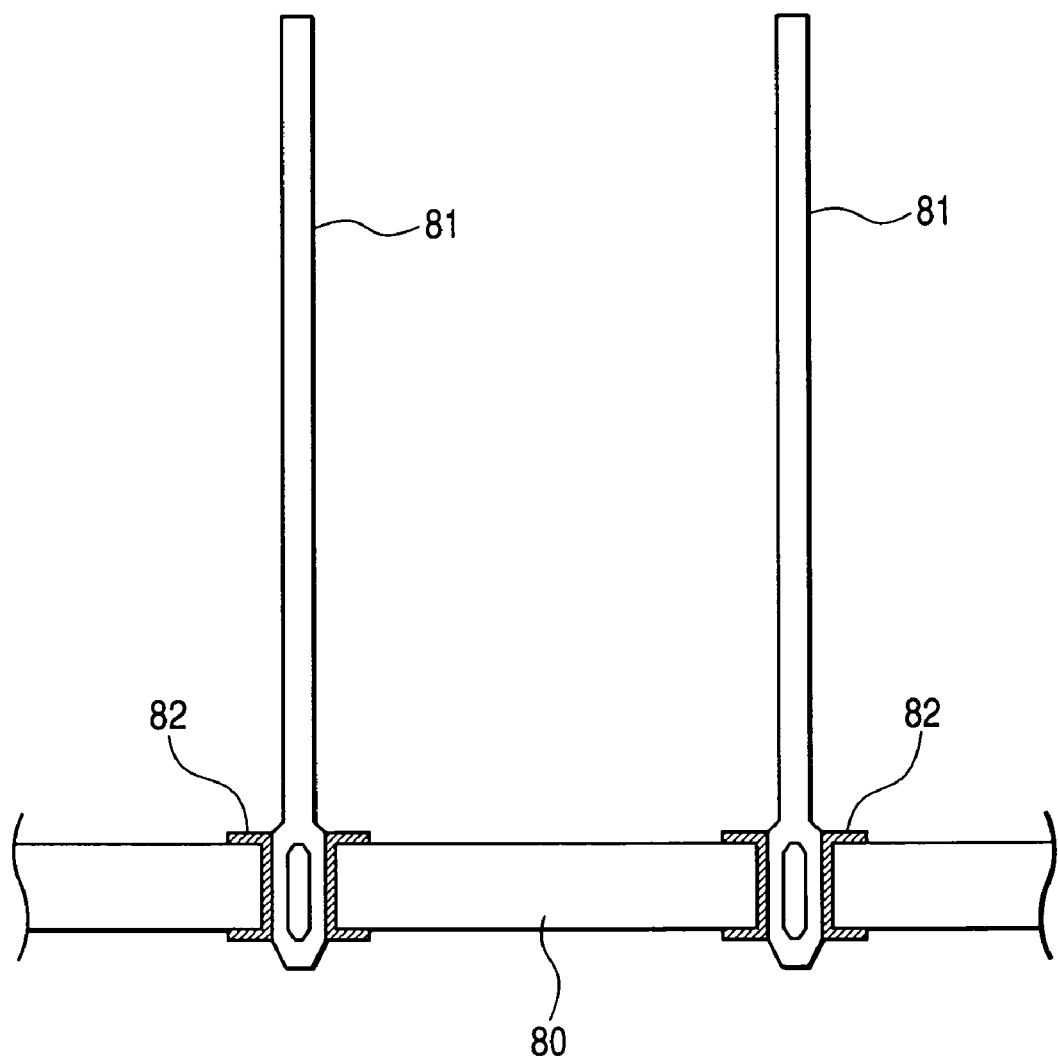
FIG. 13 is a view explaining connector pins inserted into through-holes by press fitting.

Namely, as shown in FIG. 13, rear ends of respective connector pins 81 are press-fitted into through-holes 82 provided on a rigid portion 80. Through this press-fitting operation, each connector pin 81 is electrically connected to the rigid portion 80 and also mechanically fixed.

In general, the solder joint requires successive plural processes of inserting the connector pins into through-holes, fixing the inserted connectors, and soldering them. In this respect, the above-described press-fitting operation requires only one process of inserting the connector pins into through-holes to mount the connectors. Accordingly, the press-fitting operation brings the effect of simplifying mounting processes of the connectors and accordingly simplifying manufacturing processes of the electronic control device.

Furthermore, according to the above-described embodiments, the rigid portions R1 and R4 positioned at both ends of the circuit substrate are arranged to mount the connectors 5 and 6 only. However, it is possible to arrange the rigid portions R1 and R4 to mount electronic components together with the connectors. Furthermore, in the case of employing the press-fitting operation for mounting the connectors on the rigid portions as explained with reference to FIG. 13, there will be the possibility that respective rigid portions may cause distortions. Accordingly, in such a case, it is desirable to mount no electronic components on the rigid portions mounting the connectors.

Figure 14:
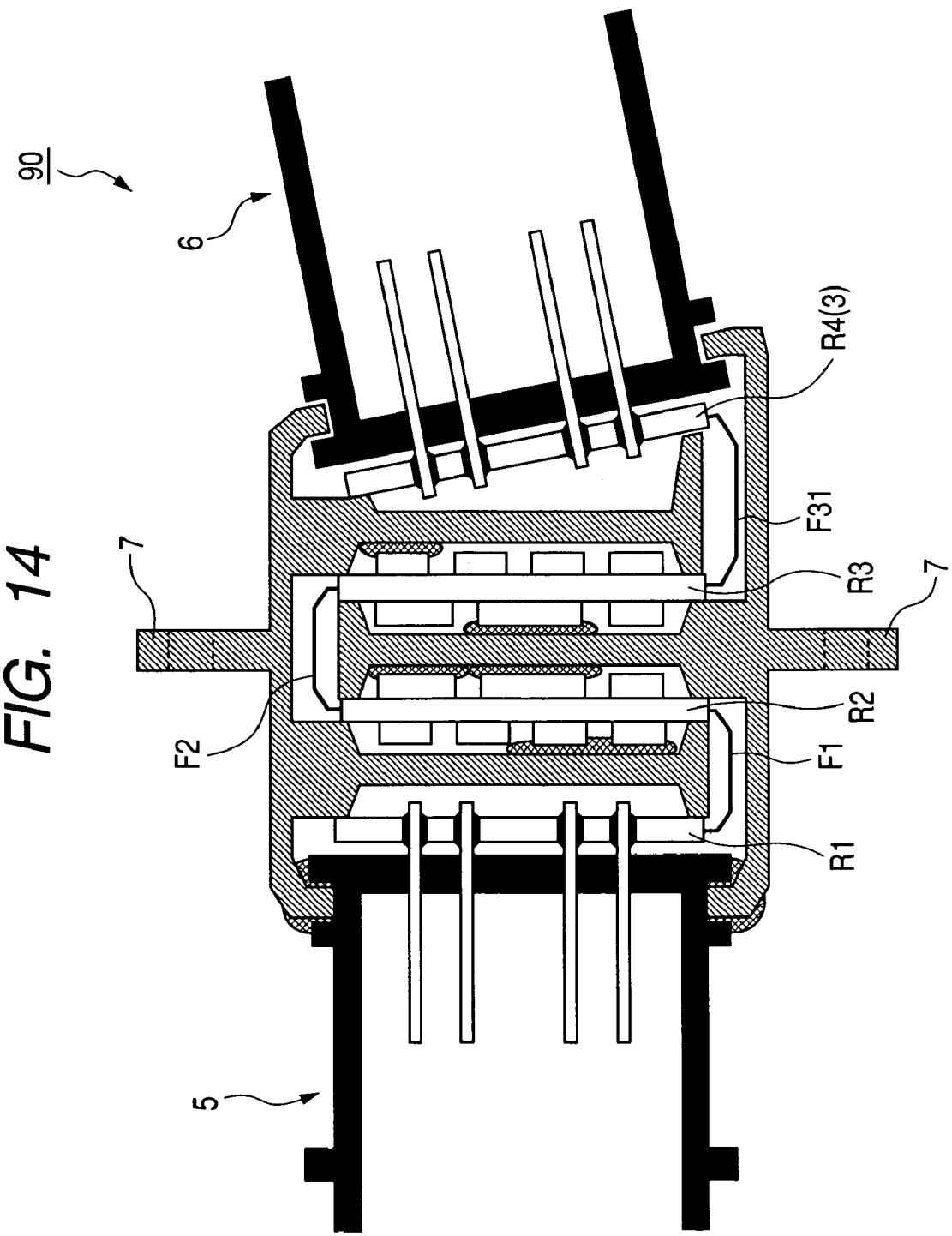
FIG. 14 is a cross-sectional view showing another arrangement of the electronic control device in accordance with the present invention.
Figure 15:
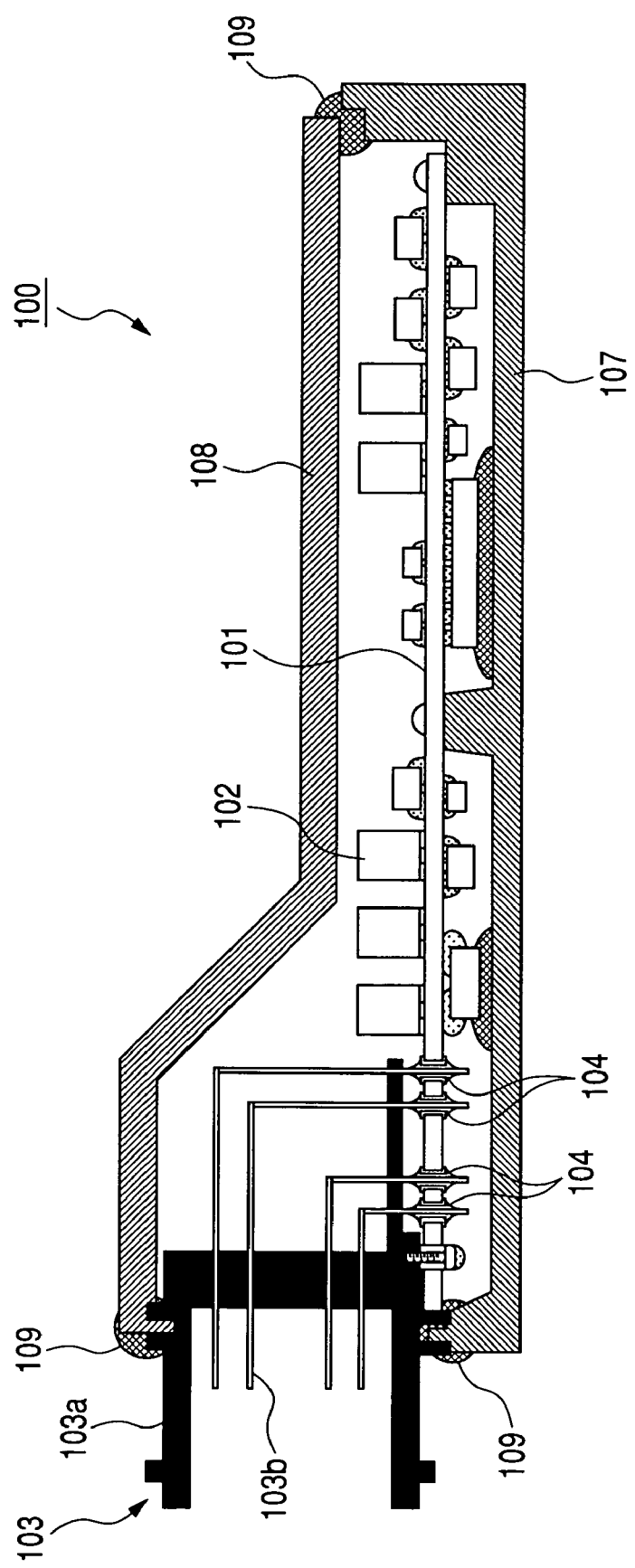
FIG. 15 is a cross-sectional view showing a conventional electronic control device.

Furthermore, according to the above-described embodiments, the rigid portions R1 to R4 of the circuit substrate 3 are disposed in parallel with each other in the casing 2. However, it is not always necessary to dispose all of the rigid portions to be parallel to each other. FIG. 14 shows an electronic control device 90 including the rigid portion R4 disposed in a non-parallel relationship with other rigid portions R1 to R3.

According to the arrangement of FIG. 14, only the rigid portion R4 is not parallel to other rigid portions. It is however preferable to dispose other rigid portions to be not parallel to each other. And, the flexible portions can be folded at arbitrary angles. Namely, as far as the flexible portions are foldable at an angle greater than 90° to form an acute intersectional angle between the planes of two neighboring rigid portions, the circuit substrate can be configured into a desirable shape.

To effectively reduce the size of the electronic control device, it is preferable to fold respective flexible portions F1 to F3 at the angle of 180° so that all of the rigid portions R1 to R4 are disposed in parallel to each other, as disclosed in the above-described embodiments.

Furthermore, in the case that the electronic control device 1 is supported on the partition wall 60 of an automotive vehicle as shown in FIG. 7, it is preferable to provide a heat insulating material to the surface of the electronic control device 1 to be exposed to the engine room. In this case, the cover 4 and the connector housing 5a are resin-made members and accordingly possess adequate heat insulation properties. Thus, it is possible to provide a heat insulating material to the surface of the casing 2.

Providing the heat insulating material brings the effects of suppressing heat transfer from the engine room to the inside of electronic control device 1 and also decreasing the temperature of the electronic control device 1 to a lower level equivalent to the temperature of the passenger compartment.

Furthermore, according to the above-described embodiments, the present invention is applied to a vehicular electronic control device for controlling an engine of this automotive vehicle. For example, it is needless to say that the present invention can be applied to an electronic control device for controlling an automotive transmission, or an electronic control device for controlling doors or other devices installed in the automotive vehicle.

Furthermore, the present invention is not limited to the control devices for the automotive vehicles and accordingly can be applied to various electronic control devices other than the automotive vehicles.

What is claimed is:

1. An electronic control device comprising:
    a substrate block including at least three rigid substrates which are serially connected via electrically conductive members to form a three-dimensional structure, two rigid substrates, each being positioned at one of both ends of said substrate block and each including mounting connectors to be coupled to connectors of external connection objects;
    a casing having a plurality of partition plates dividing an inside space of the casing into a plurality of small spaces for accommodating said rigid substrates of said substrate block such that said connectors of the rigid substrate positioned at each end of said substrate block are each exposed outside the casing at least at portions where said connectors are coupled with external connection objects; and a heat-generating component mounted on at least one of the rigid substrates other than said two rigid substrates positioned at respective ends of the substrate block, said casing and said partition plates being made of metal to facilitate uniform temperature distribution in said electronic control device, and said heat-generating component being in contact with a respective partition plate via a material having thermal conductivity higher than thermal conductivity of air so as to transfer heat from said heat-generating component to work the outside of said casing.

2. The electronic control device in accordance with claim 1, wherein:

said substrate block is folded in such a manner that an acute intersectional angle is formed between substrate planes of two neighboring rigid substrates, rigid substrates other than said two rigid substrates positioned at ends of said substrate block are positioned as inner rigid substrates inside said casing, said two end-positioned rigid substrates are connected to respective ends of said inner rigid substrates and disposed at mutually opposite positions with respect to substrate planes of said inner rigid substrates, electronic components are mounted at least one said inner rigid substrates, and said connectors provided on said two end-positioned rigid substrates have connector pins extending outwardly and perpendicularly from substrate planes of their respectively corresponding rigid substrates.

3. The electronic control device in accordance with claim 1, wherein said rigid substrates disposed parallel to each other.

4. The electronic control device in accordance with claim 2, wherein said substrate block consists of an even number of rigid substrates.

5. The electronic control device in accordance with claim 1, wherein said electrically conductive members are flexible substrates.

6. The electronic control device in accordance with claim 5, wherein said substrate block provides a circuit substrate including said rigid substrates and said flexible substrates which are electrically and physically integrated together.

7. The electronic control device in accordance with claim 6, wherein said circuit substrate comprises a batch lamination substrate including a thermoplastic resin base material.

8. The electronic control device in accordance with claim 1, wherein:

said partition plates each have an end portions facing to an inner surface of said casing to define guide respectively corresponding passages for guiding said electrically conductive members, and said plurality of spaces and said guide passages cooperatively form a continuously extending folded space in said casing.

9. The electronic control device in accordance with claim 1, wherein said partition plates have recesses formed at portions facing electronic components mounted on said rigid substrates.

10. The electronic control device in accordance with claim 1, wherein said partition plates are integrally assembled with said substrate block and detachable from said casing.

11. The electronic control device in accordance with claim 1, wherein:

said heat-generating component comprises a packaged component including a semiconductor chip having an active face and a silicone face provided on mutually opposed surfaces thereof, and said silicone face is disposed as a heat dissipation plane.

12. The electronic control device in accordance with claim 1, wherein:

said two end-positioned rigid substrates have through-holes into which connector pins are inserted, and electric connections between said rigid substrates and said connector pins are provided by press-fitting rear ends of said connector pins into respectively corresponding said through-holes formed on corresponding rigid substrates.

13. The electronic control device in accordance with claim 12, wherein said two end-positioned rigid substrates arranged so as to mount only said connectors.

14. The electronic control device in accordance with claim 1, wherein:

said electronic control device is installed in an automotive vehicle;

one connector coupled with one of said connectors mounted on said two end-positioned rigid substrates is connected to a device positioned in a vehicular engine compartment, and another connector coupled with another of said connectors mounted on said two end-positioned rigid substrates connected to a device positioned in a vehicular passenger compartment.

15. The electronic control device in accordance with claim 14, wherein:

said automotive vehicle has a partition wall separating said engine compartment from said passenger compartment, and said electronic control device is provided on said partition wall in such a manner that one of said connectors mounted on said two end-positioned rigid substrates is exposed to said engine compartment and the other of said connectors mounted on said two end-positioned rigid substrates is exposed to said passenger compartment.

16. The electronic control device in accordance with claim 15, wherein said electronic control device is arranged with a surface area exposed to said passenger compartment being larger than a surface area exposed to said engine compartment.

17. The electronic control device in accordance with claim 15, wherein a heat insulating material is provided on a surface exposed to said engine compartment and said heat insulating material has thermal conductivity lower than that of air.

18. The electronic control device in accordance with claim 15, wherein said electronic control device has an air-permeable clearance spatially connecting an inside space of said casing to said passenger compartment.

19. The electric control device in accordance with claim 1, where said member arranged between said heat generating component and a respective said partition plate is made of a heat dissipation gel andlor a heat dissipation sheet.

20. The electric control device in accordance with claim 15, wherein said casing includes flanges for fastening said casing to said partition wall so as to transmit heat from said casing to said partition wall.

* * * * *